US010162236B2

United States Patent
Wang et al.

(10) Patent No.: US 10,162,236 B2
(45) Date of Patent: Dec. 25, 2018

(54) ARRAY SUBSTRATE AND LIQUID CRYSTAL DISPLAY DEVICE COMPRISING THE SAME

(71) Applicants: Shenzhen China Star Optoelectronics Technology Co., Ltd., Shenzhen (CN); Wuhan China Star Optoelectronics Technology Co., Ltd., Wuhan (CN)

(72) Inventors: Cong Wang, Shenzhen (CN); Peng Du, Shenzhen (CN)

(73) Assignees: SHENZHEN CHINA STAR OPTOELECTRONICS TECHNOLOGY CO., LTD., Shenzhen (CN); WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 14/907,915

(22) PCT Filed: Dec. 8, 2015

(86) PCT No.: PCT/CN2015/096676
§ 371 (c)(1),
(2) Date: Aug. 29, 2017

(87) PCT Pub. No.: WO2017/059625
PCT Pub. Date: Apr. 13, 2017

(65) Prior Publication Data
US 2017/0357134 A1 Dec. 14, 2017

(30) Foreign Application Priority Data

Oct. 10, 2015 (CN) .......................... 2015 1 0652234

(51) Int. Cl.
*H01L 29/04* (2006.01)
*G02F 1/1362* (2006.01)
(Continued)

(52) U.S. Cl.
CPC ...... *G02F 1/136227* (2013.01); *G02F 1/1368* (2013.01); *G02F 1/133345* (2013.01);
(Continued)

(58) Field of Classification Search
CPC ............... H01L 27/124; H01L 27/1248; G02F 1/136227
See application file for complete search history.

(56) References Cited

U.S. PATENT DOCUMENTS

2002/0085167 A1  7/2002  Kim
2013/0299830 A1  11/2013  Ishigaki et al.
(Continued)

FOREIGN PATENT DOCUMENTS

CN  103107135 A  5/2013
CN  103389605 A  11/2013
(Continued)

OTHER PUBLICATIONS

Office Action dated Jun. 29, 2017, by the State Intellectual Property Office of People's Republic of China in corresponding Chinese Patent Application No. 201510652234.9. (6 pages).

(Continued)

*Primary Examiner* — Samuel Gebremariam
(74) *Attorney, Agent, or Firm* — Buchanan Ingersoll & Rooney PC

(57) ABSTRACT

An array substrate and a liquid crystal display device comprising the array substrate are disclosed. The array substrate comprises a pixel unit having a thin film transistor region and a through-hole region. The pixel unit comprises a glass substrate, a first insulation layer, a second insulation layer, a third insulation layer, a fourth insulation layer, and a fifth insulation layer stacked from bottom up in sequence. In the thin film transistor region, the glass substrate is provided with a light-shading metal member that is covered (Continued)

by the first insulation layer, the first insulation layer is provided with an active layer that is covered by the second insulation layer, two ends of the active layer are respectively connected with a source and a drain formed between the third insulation layer and the fourth insulation layer, the second insulation layer is provided with a gate that is covered by the third insulation layer, and the fourth insulation layer is provided with a common electrode that is covered by the fifth insulation layer. In the through-hole region, a pixel electrode is arranged on the fifth insulation layer and a through hole is configured in the fourth insulation layer, so that the pixel electrode is connected with the source or the drain after passing through the fifth insulation layer. A cushion layer is arranged under the through hole in an insulated manner.

20 Claims, 3 Drawing Sheets

(51) Int. Cl.
*G02F 1/1343* (2006.01)
*G02F 1/1368* (2006.01)
*G02F 1/1333* (2006.01)
*H01L 27/12* (2006.01)

(52) U.S. Cl.
CPC .. *G02F 1/134309* (2013.01); *G02F 1/136209* (2013.01); *G02F 2001/13685* (2013.01); *G02F 2201/121* (2013.01); *G02F 2201/123* (2013.01); *G02F 2202/104* (2013.01); *H01L 27/124* (2013.01); *H01L 27/1248* (2013.01)

(56) References Cited

U.S. PATENT DOCUMENTS

| | | |
|---|---|---|
| 2015/0129881 A1 | 5/2015 | Kong et al. |
| 2015/0241774 A1 | 8/2015 | Nakata et al. |
| 2016/0079278 A1 | 3/2016 | Wei et al. |

FOREIGN PATENT DOCUMENTS

| | | |
|---|---|---|
| CN | 103456740 A | 12/2013 |
| CN | 104704546 A | 6/2015 |
| JP | 2011-100057 A | 5/2011 |
| JP | 2012-228480 A | 11/2012 |

OTHER PUBLICATIONS

Notification of Transmittal of the International Search Report and the Written Opinion of the International Searching Authority (Forms PCT/ISA/210, PCT/ISA/237, and PCT/ISA/220) dated Jul. 15, 2016, by the State Intellectual Property Office of People's Republic of China Patent Office in corresponding International Application No. PCT/CN2015/096676. (13 pages).

ARRAY SUBSTRATE AND LIQUID CRYSTAL DISPLAY DEVICE COMPRISING THE SAME

CROSS-REFERENCE TO RELATED APPLICATIONS

The present application claims the priority of Chinese patent application CN201510652234.9, entitled "array substrate and liquid crystal display device comprising the same" and filed on Oct. 10, 2015, the entirety of which is incorporated herein by reference.

TECHNICAL FIELD

The present disclosure relates to the technical field of display, in particular to an array substrate and a liquid crystal display device comprising the array substrate.

TECHNICAL BACKGROUND

During designing and manufacturing procedure of a low temperature poly-silicon panel, if a film surface on a side of an array substrate is irregular, poor alignment of liquid crystal of a liquid crystal display device would occur.

In the prior art, a thickness of an insulation layer between a common electrode and a source/drain is usually increased so as to flatten the film surface and improve the alignment performance of liquid crystal. However, since the insulation layer has a relative larger thickness compared with other film layers, it is necessary to arrange a via hole in the insulation layer when the source/drain of a thin film transistor breakover needs to be connected with a pixel electrode. Because the insulation layer is made from high molecular material and comprises relatively deep via holes, in the preparation procedure, it will be easy for the insulation layer to be separated from a film layer which is originally in contact with the insulation layer. As a result, the pixel electrode and the source or the drain would have a poor contact or even be disconnected from each other, thereby affecting normal display of the liquid crystal display device. In this case, the thickness of the insulation layer should be reduced so as to lower the risk of poor contact. However, if the thickness of the insulation layer is reduced, a flatness of the insulation layer would be affected, which would causes poor alignment of the liquid crystal.

In this case, a new array substrate that can improve the contact between the pixel electrode and the source/drain without affecting the flatness of the insulation layer is needed.

SUMMARY OF THE INVENTION

Directed at the technical problems in the prior art, the present disclosure provides an array substrate and a liquid crystal display device comprising the array substrate. The array substrate according to the present disclosure can not only guarantee a flatness of an insulation layer, so as to satisfy requirements for an alignment of liquid crystal, but also improve contact between a pixel electrode and a source/drain, thereby improving a display performance of the liquid crystal display device.

According to one aspect of the present disclosure, an array substrate is provided. The array substrate comprises a pixel unit having a thin film transistor region and a through-hole region. The pixel unit comprises a glass substrate, a first insulation layer, a second insulation layer, a third insulation layer, a fourth insulation layer, and a fifth insulation layer stacked from bottom up in sequence. In the thin film transistor region, the glass substrate is provided with a light-shading metal member that is covered by the first insulation layer, the first insulation layer is provided with an active layer that is covered by the second insulation layer, two ends of the active layer are respectively connected with a source and a drain formed between the third insulation layer and the fourth insulation layer, the second insulation layer is provided with a gate that is covered by the third insulation layer, and the fourth insulation layer is provided with a common electrode that is covered by the fifth insulation layer. In the through-hole region, a pixel electrode is arranged on the fifth insulation layer and a through hole is configured in the fourth insulation layer, so that the pixel electrode is connected with the source or the drain after passing through the fifth insulation layer. A cushion layer is arranged under the through hole in an insulated manner.

In an embodiment, the cushion layer is a metal layer, and at least one metal layer that corresponds to the light-shading metal member, the active layer or the gate is arranged under the through hole.

In an embodiment, three metal layers that respectively correspond to the light-shading metal member, the active layer and the gate are arranged under the through hole.

In an embodiment, the metal layers are formed by a same procedure as the corresponding light-shading metal member, the active layer or the gate.

In an embodiment, an inner wall of the through hole is structured as stepladder, and the fifth insulation layer and the pixel electrode are both structured to match the stepladder through hole.

In an embodiment, teeth of the stepladder through hole are distributed in a uniform manner.

In an embodiment, the through hole is formed by an exposure process and a light transmittance of a photomask for forming the through hole gradually decreases from a central part to a peripheral part thereof.

In an embodiment, a taper angle of the through hole is structured in a range from 45° to 50°.

In an embodiment, the through hole is formed by an exposure process, and a photomask for forming the through hole comprises a cut-out with a wall thereof being structured as a tooth.

According to the other aspect of the present disclosure, a liquid crystal display device comprising said array substrate is provided.

Compared with the prior art, the present disclosure has the following advantages. Through arranging a cushion layer under the through hole, a thickness under the through hole can be increased, thereby reducing a depth of the through hole without changing the fourth insulation layer. Therefore, poor contact or even disconnection between the pixel electrode and the source or the drain can be effectively alleviated, and a qualified rate of the liquid crystal display device can be improved.

BRIEF DESCRIPTION OF THE DRAWINGS

A brief introduction will be provided below to the accompanying drawings involved in the embodiments. In the drawings.

Figure 1:
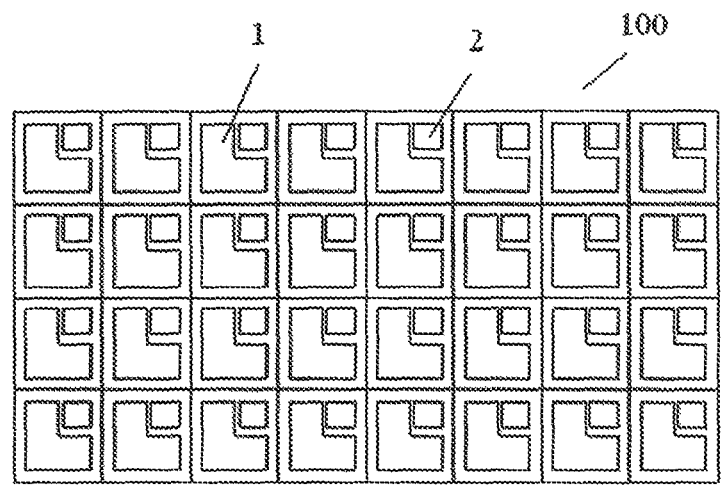
FIG. 1 shows an array substrate according to an embodiment of the present disclosure.

In the drawings, the same components are indicated with the same reference sign. The drawings are not drawn to actual scale.

DETAILED DESCRIPTION OF THE EMBODIMENTS

The present disclosure will be further described in view of the accompanying drawings.

Figure 2:
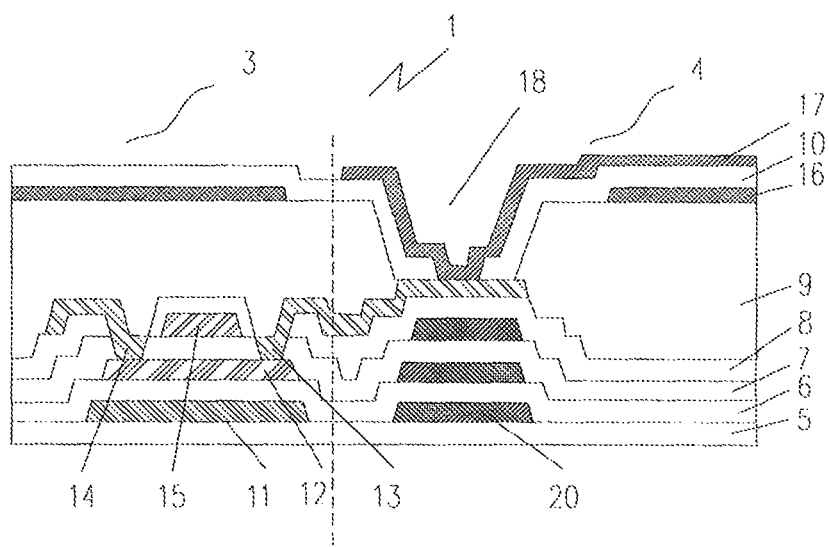
FIG. 2 shows a pixel unit according to a first embodiment of the present disclosure.

FIG. 1 shows an array substrate 100 according to the present disclosure. The array substrate 100 comprises a plurality of pixel units 1 (i.e., sub pixel units) distributed as an array. Each pixel unit 1 is comprised of a thin film transistor 2, a pixel electrode 17 (as shown in FIG. 2), a common electrode 16 (as shown in FIG. 2) and a storage capacitor (not shown herein). The thin film transistor 2 is a low temperature poly-silicon (hereinafter referred to as LTPS) thin film transistor, which has a higher carrier mobility ratio compared with traditional amorphous silicon (a-Si) thin film transistor, and thus higher resolution and lower power consumption, as well as a higher integration level of members on the array substrate can be realized.

As shown in FIG. 2, the pixel unit 1 comprises a glass substrate 5, a first insulation layer 6, a second insulation layer 7, a third insulation layer 8, a fourth insulation layer 9, and a fifth insulation layer 10 stacked from bottom up in sequence. In a thin film transistor region 3, the glass substrate 5 is provided with a light-shading metal member 11, and the light-shading metal member 11 can be covered by the first insulation layer 6. The first insulation layer 6 is provided with an active layer 12, and the active layer 12 can be covered by the second insulation layer 7. A source 13 and a drain 14 are formed between the third insulation layer 8 and the fourth insulation layer 9, and the source 13 and the drain 14 are respectively arranged at two ends of the active layer 12. The second insulation layer 7 is provided with a gate 15 that can be covered by the third insulation layer 8. The fourth insulation layer 9 is provided with the common electrode 16 that can be covered by the fifth insulation layer 10. In the through-hole region 4, the pixel electrode 17 is arranged on the fifth insulation layer 10. A through hole 18 is configured in the fourth insulation layer 9, so that the pixel electrode 17 is connected with the source 13 or the drain 14 after passing through the fifth insulation layer 10. A cushion layer for reducing a depth of the through hole 18 is arranged under the through hole 18 in an insulated manner. In this case, disconnection between the pixel electrode 17 and the source 13 or the drain 14 can be alleviated or even avoided, thereby guaranteeing a firm contact between the pixel electrode 17 and the source 13 or the drain 14. Therefore, a qualified rate of the array substrate 100 can be guaranteed.

According to an embodiment of the present disclosure, the cushion layer is configured as a metal layer 20 arranged under the through hole 18. The metal layer 20 is insulated from outside environment. That is, no signal is provided to the metal layer 20, which only acts as a member to increase a thickness of a layer under the through hole 18, so that a depth of the through hole 18 decreases without changing the fourth insulation layer 9. If the through hole 18 is too deep, the fourth insulation layer 9 and the fifth insulation layer 10 are easily separated from each other, which would cause disconnection or poor contact between the pixel electrode 17 and the source 13 or the drain 14. With the abovementioned arrangement, the depth of the through hole 18 can be effectively reduced, and thus the disconnection or poor contact risk can be effectively reduced or even avoided. Therefore, with the arrangement of the metal layer 20, a safety of connection between the pixel electrode 17 and the source 13 or the drain 14 can be improved. In addition, such arrangement has a simple structure and can be realized easily.

Preferably, at least one metal layer 20 corresponding to the light-shading metal member 11, the active layer 12 or the gate 15 is arranged under the through hole 18. For example, one metal layer 20 can be arranged under the through hole 18, and the metal layer 20 corresponds to one of the light-shading metal member 11, the active layer 12 and the gate 15. Alternatively, two metal layers 20 can be arranged under the through hole 18, and the metal layers 20 respectively correspond to two of the light-shading metal member 11, the active layer 12 and the gate 15. Of course, three metal layers 20 can be arranged under the through hole 18, the metal layers 20 respectively correspond to the light-shading metal member 11, the active layer 12 and the gate 15, and are respectively arranged between adjacent first insulation layer 6, second insulation layer 7 and third insulation layer 8.

Further preferably, the metal layer 20 is formed by a same procedure as the corresponding light-shading metal member 11, the active layer 12 or the gate 15. In this manner, the metal layer 20 can be formed simultaneously with the light-shading metal member 11, the active layer 12 or the gate 15 through a photoetching technology. In this case, the metal layer 20 can be manufactured through the existing production technology and procedure, whereby not only the goal of preventing disconnection according to the present disclosure can be reached, but also a production efficiency can be improved and a production cost can be reduced.

Figure 3:
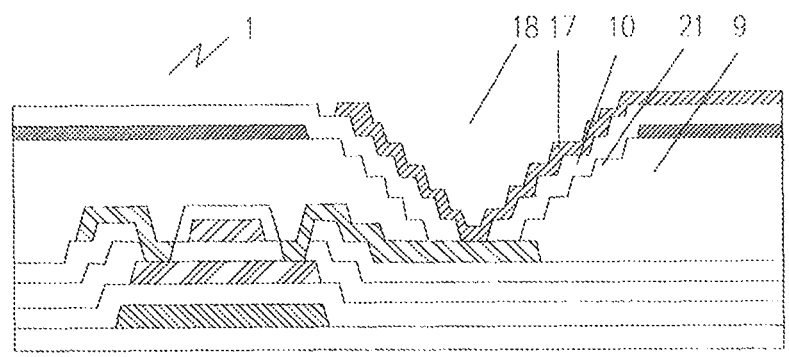
FIG. 3 shows a pixel unit according to a second embodiment of the present disclosure.

As shown in FIG. 3, an inner wall of the through hole 18 is structured as stepladder. That is, the inner wall of the through hole 18 is structured as a stepladder with teeth 21. Correspondingly, the fifth insulation layer 10 and the pixel electrode 17 are both structured to match the stepladder through hole 18. Through such arrangement, a contact area between the fifth insulation layer 10 and the fourth insulation layer 9 and a contact area between the fifth insulation layer 10 and the pixel electrode 17 can both be increased. Under the condition that the depth of the through hole 18 does not change, the larger the contact area between the fifth insulation layer 10 and the fourth insulation layer 9 and the contact area between the fifth insulation layer 10 and the pixel electrode 17, the smaller a deformation of the fifth insulation layer 10 and the pixel electrode 17, and the more difficult for the fifth insulation layer 10 and the fourth insulation layer 9 to be separated from the pixel electrode 17. Therefore, the risk of disconnection between the pixel electrode 17 and the source 13 or the drain 14 can be effectively reduced or prevented. In order to facilitate manufacturing and reduce production cost, the teeth 21 of the stepladder through hole 18 are distributed in a uniform manner, thereby reducing production difficulty.

Figure 5:
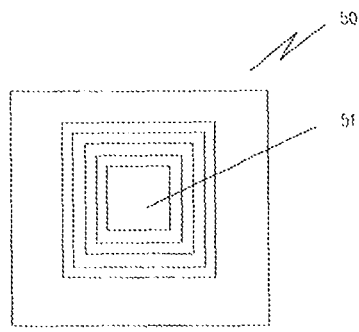
FIG. 5 shows a photomask according to the first embodiment of the present disclosure.

For example, the through hole 18 with teeth 21 can be formed by an exposure procedure. In a production procedure, a photomask 50 can be used to form the through hole 18 as shown in FIG. 3. The photomask 50 has a cut-out 51 therein. A size of the cut-out 51 matches a shape of an opening on a lower end of the through hole 18 and a light transmittance of the photomask 50 gradually decreases from the cut-out 51 to a peripheral part thereof (the frames in FIG. 5 schematically show the difference of light transmittance from a central part of the mask 50 to a peripheral part thereof). In this manner, a through hole 18 as shown in FIG. 3 can be formed after etching procedure.

It should be noted that, since the metal layer 20 is arranged under the through hole 18 and the through hole 18 is configured as a stepladder, the risk of disconnection between the pixel electrode 17 and the source 13 or the drain 14 can be further reduced or prevented. That is, a firmness and security of the connection between the pixel electrode 17 and the source 13 or the drain 14 can be improved. Of course, if the array substrate 100 comprises only the stepladder through hole 18 or only the metal layer 20, the effect of improving security of connection between the pixel electrode 17 and the source 13 or the drain 14 can also be achieved.

Figure 4:
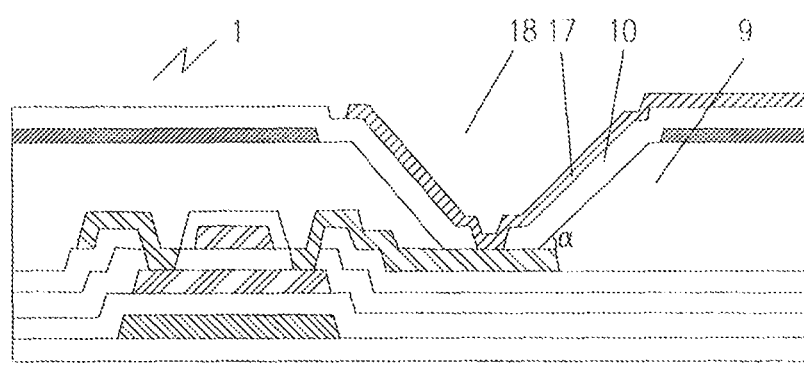
FIG. 4 shows a pixel unit according to a third embodiment of the present disclosure.

As shown in FIG. 4, a taper angle α of the through hole 18 is structured in a range from 45° to 50°. In the prior art, the taper angle α is about 56°. When the depth of the through hole 18 does not change, the larger the tapper angle α, the smaller the contact area between the fourth insulation layer 9 and the fifth insulation layer 10, and the easier for the fifth insulation layer 10 to be separated from the fourth insulation layer 9 and the pixel electrode 17. In this case, by reducing the taper angle α to a range from 45° to 50°, the contact area between fourth insulation layer 9 and the fifth insulation layer 10 can be increased, and a climbing angle of the fifth insulation layer 10 relative to the fourth insulation layer 9 can be reduced and increasing the contact area therebetween. As a result, the risk of disconnection between the pixel electrode 17 and the source 13 or the drain 14 can be reduced or prevented.

Figure 6:
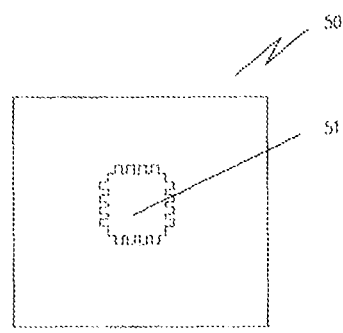
FIG. 6 shows a photomask according to the second embodiment of the present disclosure.
Figure 7:
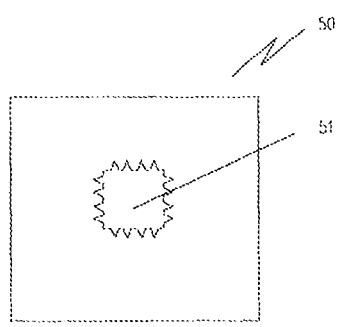
FIG. 7 shows a photomask according to the third embodiment of the present disclosure.

For example, the through hole 18 can be formed by an exposure procedure. The photomask 50 used for forming the through hole 18 has a cut-out 51 and a wall of the cut-out 51 is structured as teeth, as shown in FIGS. 6 and 7. In a production procedure, since the wall of the cut-out 51I is structured as teeth, under light irradiation, teeth-like slits around the cut-out 51 of the photomask 50 would form slit diffraction, such that the periphery of the through hole 18 allows slight transmittance of light. After etching procedure, the taper angle α would become smaller.

It should be noted that, since the metal layer 20 is arranged under the through hole 18, and the taper angle α is configured in a range from 45° to 50°, the risk of disconnection between the pixel electrode 17 and the source 13 or the drain 14 can be further reduced or prevented. That is, a firmness and security of connection between the pixel electrode 17 and the source 13 or the drain 14 can be improved. Of course, as shown in FIG. 4, in the array substrate 100, the risk of disconnection can also be reduced by only configuring the taper angle α in a range from 45° to 50°. In a word, in order to reach the goal of ensuring solid connection between the pixel electrode 17 and the source 13 or the drain 14, the three techniques, i.e., arranging the cushion layer, configuring the inner wall of the through hole 18 as a stepladder, and arranging a taper angle, can be selected separated or simultaneously according to actual needs.

The present disclosure further comprises a liquid crystal display device (not shown in the drawings). The liquid crystal display device comprises said array substrate 100. Of course, the liquid crystal display device further comprises some other members and structures, which are well known to the person skilled in the art, and thus will not be described in detail.

Although the present disclosure has been described in view of preferred embodiments, the scope of the present disclosure is not limited hereto. Various modifications and variants to the present disclosure may be made by anyone skilled in the art, without departing from the scope and spirit of the present disclosure. Therefore, the scope of the present disclosure is subject to the scope of the claims.

The invention claimed is:

1. An array substrate, comprising a pixel unit having a thin film transistor region and a through-hole region,
   wherein the pixel unit comprises a glass substrate, a first insulation layer, a second insulation layer, a third insulation layer, a fourth insulation layer, and a fifth insulation layer stacked from bottom up in sequence;
   wherein in the thin film transistor region, the glass substrate is provided with a light-shading metal member that is covered by the first insulation layer, the first insulation layer is provided with an active layer that is covered by the second insulation layer, two ends of the active layer are respectively connected with a source and a drain formed between the third insulation layer and the fourth insulation layer, the second insulation layer is provided with a gate that is covered by the third insulation layer, and the fourth insulation layer is provided with a common electrode that is covered by the fifth insulation layer;
   wherein in the through-hole region, a pixel electrode is arranged on the fifth insulation layer and a through hole is configured in the fourth insulation layer, so that the pixel electrode is connected with the source or the drain after passing through the fifth insulation layer; and
   wherein a cushion layer is arranged under the through hole in an insulated manner.

2. The array substrate according to claim 1, wherein the cushion layer is a metal layer, and at least one metal layer that corresponds to the light-shading metal member, the active layer or the gate is arranged under the through hole.

3. The array substrate according to claim 2, wherein three metal layers that respectively correspond to the light-shading metal member, the active layer and the gate are arranged under the through hole.

4. The array substrate according to claim 3, wherein the metal layers are formed by a same procedure as the corresponding light-shading metal member, the active layer or the gate.

5. The array substrate according to claim 4, wherein an inner wall of the through hole is structured as stepladder, and the fifth insulation layer and the pixel electrode are both structured to match the stepladder through hole.

6. The array substrate according to claim 5, wherein teeth of the stepladder through hole are distributed in a uniform manner.

7. The array substrate according to claim 4, wherein a taper angle of the through hole is structured in a range from 45° to 50°.

8. The array substrate according to claim 3, wherein an inner wall of the through hole is structured as stepladder, and the fifth insulation layer and the pixel electrode are both structured to match the stepladder through hole.

9. The array substrate according to claim 8, wherein teeth of the stepladder through hole are distributed in a uniform manner.

10. The array substrate according to claim 3, wherein a taper angle of the through hole is structured in a range from 45° to 50°.

11. The array substrate according to claim 2, wherein an inner wall of the through hole is structured as stepladder, and the fifth insulation layer and the pixel electrode are both structured to match the stepladder through hole.

12. The array substrate according to claim 11, wherein teeth of the stepladder through hole are distributed in a uniform manner.

13. The array substrate according to claim 2, wherein a taper angle of the through hole is structured in a range from 45° to 50°.

14. The array substrate according to claim 13, wherein the through hole is formed by an exposure procedure, and a photomask for forming the through hole comprises a cut-out with a wall thereof being structured as a tooth.

15. The array substrate according to claim 1, wherein an inner wall of the through hole is structured as stepladder, and the fifth insulation layer and the pixel electrode are both structured to match the stepladder through hole.

16. The array substrate according to claim 15, wherein teeth of the stepladder through hole are distributed in a uniform manner.

17. The array substrate according to claime 16, wherein the through hole is formed by an exposure process and a light transmittance of a photomask for forming the through hole gradually decreases from a central part to a peripheral part thereof.

18. The array substrate according to claim 1, wherein a taper angle of the through hole is structured in a range from 45° to 50°.

19. The array substrate according to claim 18, wherein the through hole is formed by an exposure procedure, and a photomask for forming the through hole comprises a cut-out with a wall thereof being structured as a tooth.

20. A liquid crystal display device, comprising an array substrate, which comprises a pixel unit having a thin film transistor region and a through-hole region,
  wherein the pixel unit comprises a glass substrate, a first insulation layer, a second insulation layer, a third insulation layer, a fourth insulation layer, and a fifth insulation layer stacked from bottom up in sequence;
  wherein in the thin film transistor region, the glass substrate is provided with a light-shading metal member that is covered by the first insulation layer, the first insulation layer is provided with an active layer that is covered by the second insulation layer, two ends of the active layer are respectively connected with a source and a drain formed between the third insulation layer and the fourth insulation layer, the second insulation layer is provided with a gate that is covered by the third insulation layer, and the fourth insulation layer is provided with a common electrode that is covered by the fifth insulation layer;
  wherein in the through-hole region, a pixel electrode is arranged on the fifth insulation layer and a through hole is configured in the fourth insulation layer, so that the pixel electrode is connected with the source or the drain after passing through the fifth insulation layer; and
  wherein a cushion layer is arranged under the through hole in an insulated manner.

\* \* \* \* \*